United States Patent
Reinprecht

(10) Patent No.: US 9,379,068 B2
(45) Date of Patent: Jun. 28, 2016

(54) ESD PROTECTION SEMICONDUCTOR DEVICE

(71) Applicant: ams AG, Unterpremstaetten (AT)

(72) Inventor: Wolfgang Reinprecht, Tobelbad (AT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 14/383,512

(22) PCT Filed: Feb. 19, 2013

(86) PCT No.: PCT/EP2013/053282
§ 371 (c)(1),
(2) Date: Sep. 5, 2014

(87) PCT Pub. No.: WO2013/131743
PCT Pub. Date: Sep. 12, 2013

(65) Prior Publication Data
US 2015/0028421 A1  Jan. 29, 2015

(30) Foreign Application Priority Data
Mar. 9, 2012 (EP) .................................... 12158860

(51) Int. Cl.
*H01L 29/06* (2006.01)
*H01L 23/60* (2006.01)
*H01L 29/78* (2006.01)
*H01L 29/08* (2006.01)

(52) U.S. Cl.
CPC ............ *H01L 23/60* (2013.01); *H01L 29/0603* (2013.01); *H01L 29/0847* (2013.01); *H01L 29/78* (2013.01); *H01L 2924/0002* (2013.01)

(58) Field of Classification Search
CPC ............ H01L 27/0266; H01L 27/0296; H01L 29/0603; H01L 29/0607; H01L 29/6011
See application file for complete search history.

(56) References Cited

U.S. PATENT DOCUMENTS

| 5,714,413 A | 2/1998 | Brigham et al. |
| 6,952,039 B1 | 10/2005 | Vashchenko et al. |
| 7,180,140 B1 | 2/2007 | Brisbin et al. |
| 7,994,584 B2 * | 8/2011 | Hiraoka .......... H01L 21/823418 257/341 |
| 8,492,834 B2 * | 7/2013 | Lai ....................... H01L 29/7835 257/337 |
| 2006/0011981 A1 | 1/2006 | Lee |
| 2010/0032774 A1 | 2/2010 | Burgess et al. |

FOREIGN PATENT DOCUMENTS

CN  101924131 A  12/2010

* cited by examiner

*Primary Examiner* — Chandra Chaudhari
(74) *Attorney, Agent, or Firm* — McDermott Will & Emery LLP

(57) ABSTRACT

A semiconductor substrate (1) is provided with a source region (2) and a drain region (3) of a first type of electrical conductivity arranged at a surface (10) at a distance from one another, a channel region (4) of a second type of electrical conductivity, which is opposite to the first type of electrical conductivity, arranged between the source region (2) and the drain region (3), and a gate electrode (6) arranged above the channel region (4). A substrate well (7) of the first type of electrical conductivity is arranged in the substrate (1) at a distance from the source region (2). The substrate well (7) is contiguous with the drain region (3), and the distance between the source region (2) and the substrate well (7) is larger than the distance between the source region (2) and the drain region (3).

12 Claims, 2 Drawing Sheets

ESD PROTECTION SEMICONDUCTOR DEVICE

The invention relates to a semiconductor device with a protection against electrostatic discharge (ESD).

Some semiconductor devices, like DC/DC converter supplies, are characterized by a frequent occurrence of overvoltage spikes, which are due to high operating currents and high switching speeds generating high induction currents. The overvoltage spikes may cause undesired triggering of an integrated ESD protection device if the trigger voltage is set close above the operation voltage of the circuitry.

U.S. Pat. No. 6,952,039 B1 discloses an ESD protection snapback structure for overvoltage self-protecting I/O cells. A multiple gate NMOS structure is designed to shift the avalanche multiplication region away from the edge of the gate that is located nearest the drain. The shift is achieved by providing a lightly doped region between the nearest edge of the gate and the ballast region of the drain.

It is an object of the present invention to provide an ESD protection semiconductor device with a narrow range of the holding voltage for an elevated trigger voltage.

This object is achieved with the ESD protection semiconductor device according to claim 1. Embodiments derive from the dependent claims.

The ESD protection semiconductor device comprises a semiconductor substrate including a source region and a drain region of a first type of electrical conductivity arranged at a distance from one another at or near the substrate surface. A channel region of a second type of electrical conductivity, which is opposite to the first type of electrical conductivity, is located between the source region and the drain region, and a gate electrode is placed above the channel region. A substrate well of the first type of electrical conductivity is arranged in the substrate at a distance from the source region. The substrate well is contiguous with the drain region, and the distance between the source region and the substrate well is larger than the distance between the source region and the drain region.

In an embodiment of the ESD protection semiconductor device the substrate well is arranged below an area of the substrate surface that is encompassed by the drain region.

In a further embodiment the substrate well has a lower doping concentration than the drain region.

A further embodiment comprises a body well of the second type of electrical conductivity. The channel region is located in the body well. The substrate well is deeper than the body well, which means that the substrate well reaches down to a maximal distance from the surface of the substrate which is larger than a maximal distance from the surface that is reached by the body well.

A further embodiment comprises a further substrate well of the first type of electrical conductivity arranged in the substrate at a distance from the source region. The distance between the source region and the further substrate well is larger than the distance between the source region and the substrate well, and the electrical conductivity of the further substrate well is lower than the electrical conductivity of the substrate well. The doping concentration decreases from the drain region to the substrate well and from the substrate well to the further substrate well.

A further embodiment comprises a body well of the second type of electrical conductivity and a further substrate well of the first type of electrical conductivity arranged in the substrate at a distance from the source region. The channel region is located in the body well. The further substrate well is deeper than the body well, which means that the further substrate well reaches down to a maximal distance from the surface of the substrate which is larger than a maximal distance from the surface that is reached by the body well.

In a further embodiment the distance between the source region and the drain region, and the corresponding channel length, is adapted for a trigger voltage above 9 V and a holding voltage between 7 V and 11 V.

In a further embodiment the distance between the source region and the drain region, and the corresponding channel length, is adapted for a trigger voltage above 9.5 V and a holding voltage between 7.5 V and 12 V.

In a further embodiment the distance between the source region and the drain region is adapted for a trigger voltage above 12 V and a holding voltage that is kept in a range between voltage values that differ by not more than 25% of a median value of the range.

In a further embodiment the distance between the source region and the drain region is adapted for a trigger voltage above 12 V and a holding voltage that is kept in a range between voltage values that differ by not more than 20% of a median value of the range.

In further embodiments the range of the holding voltage is kept narrower than 8 V, preferably narrower than 5 V.

A further embodiment comprises a further source region, a further channel region, and a further gate electrode. The source region and the further source region, the channel region and the further channel region, and the gate electrode and the further gate electrode are arranged symmetrically to one another with respect to the drain region. The distance between the further source region and the substrate well is larger than the distance between the further source region and the drain region.

The following is a detailed description of examples of embodiments of the invention and its advantages in conjunction with the accompanying drawings.

Figure 1:
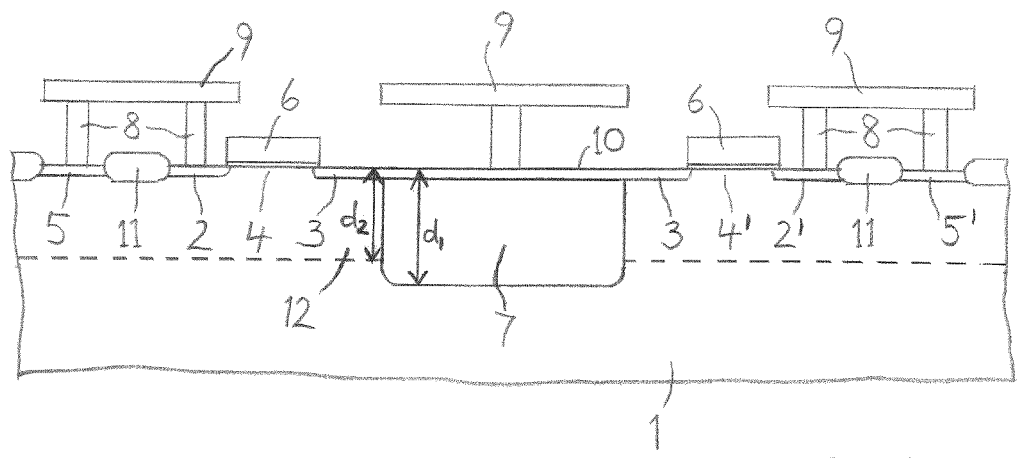
FIG. 1 shows a cross-section of an embodiment of the semiconductor device.

FIG. 1 shows a cross-section of an embodiment of the ESD protection semiconductor device. A semiconductor substrate 1, which may be silicon, is provided with a source region 2 and a drain region 3 of a first type of electrical conductivity, which are arranged at or near a main surface 10 of the substrate 1 at a distance from one another. A channel region 4 of a second type of electrical conductivity, which is opposite to the first type of electrical conductivity, is located between the source region 2 and the drain region 3. The first type of electrical conductivity may be n-type conductivity and the second type of electrical conductivity p-type conductivity or vice versa.

The channel region 4 may be an upper portion of a body well 12 of the second type of electrical conductivity, which may be formed within the substrate 1 by an implantation of a dopant, as indicated in FIG. 1 by the broken line. In this case the substrate 1 may be intrinsically conductive or moderately doped for either type of electrical conductivity. If the substrate 1 is doped for the second type of electrical conductivity and the doping concentration is sufficiently high, a dedicated body well 12 may not be necessary. The source region 2 and the drain region 3 may be embedded in the body well 12. A body contact region 5 comprising a higher doping concentration for the second type of electrical conductivity may be provided in the body well 12 for an external electrical contact of the body well 12.

A gate electrode 6 is arranged above the channel region 4 and is insulated from the semiconductor material by a gate dielectric, which may be an oxide of the semiconductor material. The source region 2, the drain region 3 and the body contact region 5 may be contacted by vias or vertical interconnects 8 and may thus be connected with a structured metal layer 9 of a wiring. Details of the wiring, which may comprise several metal layers embedded in an intermetal dielectric, are not essential for the invention and are omitted in FIG. 1. Areas of the substrate surface 10 that are not provided with the gate electrode 6 or with the interconnects 8 may be covered with isolation regions 11, which may be field oxide, shallow trench isolations or the like and may be formed by an oxide of the semiconductor material.

A substrate well 7 of the first type of electrical conductivity is arranged in the substrate 1 at a distance from the source region 2. The substrate well 7 is contiguous with the drain region 3, and the distance between the source region 2 and the substrate well 7 is larger than the distance between the source region 2 and the drain region 3. If a body well 12 is provided, the substrate well 7 is preferably deeper than the body well 12, so that the relatively steep pn-junction between the substrate well 7 and the body well 12 does not completely surround the substrate well 7, and a current flow between the substrate well 7 and the deeper regions of the substrate 1 is facilitated. In this case the substrate well 7 reaches down to a first maximal distance d1 from the surface 10 of the substrate 1, which is larger than a second maximal distance d2 from the surface 10 that is reached by the body well 12.

The transistor structure formed by the source region 2, the channel region 4 and the drain region 3 is switched on when the drain-source voltage VDS exceeds a trigger voltage. The value of the trigger voltage is low if the channel length, which is essentially defined by the distance between the source region 2 and the drain region 3, is small and short-channel effects dominate the triggering. If the channel length is large, the pn-junction between the drain region 3 and the channel region 4 is essential for the triggering. In this case the value of the trigger voltage increases with increasing channel length and hence increasing resistance between source and drain. An elevated trigger voltage of typically 9 V or more may therefore be obtained by an increased channel length. At the same time the lower limit of the holding voltage, which is the drain-source voltage after a triggered snapback, can be set to be sufficiently high, typically 7 V or more, for example. The holding voltage is preferably adjusted to be well above the operation voltage in order to prevent regular substrate currents from switching the transistor on.

The substrate well 7 is provided to generate a second snapback when the current increases and the holding voltage reaches a predefined upper voltage limit, which is intended not to be exceeded. After the second snapback has been triggered an additional electrical current occurs between the source region 2 and the substrate well 7. As a result the holding voltage is again decreased, but does not reach the preceding lower limit and is therefore kept within the admissible range.

The embodiment according to FIG. 1 is symmetrical with respect to the drain region 3. A further source region 2', a further channel region 4' and a further gate electrode 6' are arranged symmetrically to the source region 2, the channel region 4 and the gate electrode 6, respectively. The source region 2 and the further source region 2' as shown in the cross-section of FIG. 1 can be portions of a continuous region, which are connected in a plane that is parallel to the plane of the drawing. The same applies to the channel region 4 and the further channel region 4' and to the gate electrode 6 and the further gate electrode 6'. The distance between the further source region 2' and the substrate well 7 is larger than the distance between the further source region 2' and the drain region 3. The symmetrical arrangement may be favourable, but it is not necessary, and the transistor device formed by the source region 2, the channel region 4 and the gate electrode 6 on one side of the drain region 3 may suffice for the ESD protection.

Figure 2:
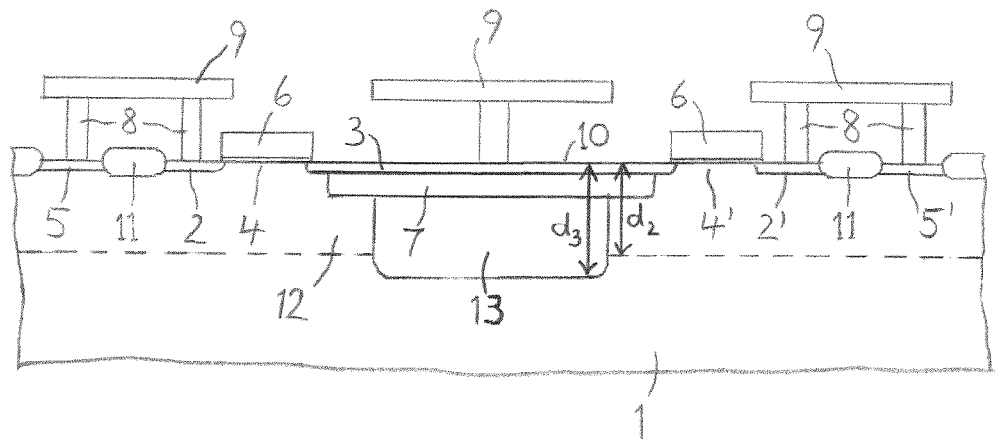
FIG. 2 shows a cross-section of a further embodiment of the semiconductor device.

FIG. 2 shows a cross-section of a further embodiment of the ESD protection semiconductor device. The elements that correspond to similar elements of the embodiment according to FIG. 1 are designated with the same reference numerals. The further embodiment according to FIG. 2 comprises a substrate well 7 and a further substrate well 13, both of the first type of electrical conductivity. The substrate well 7 is arranged in the substrate 1 at a distance from the source region 2 and is contiguous with the drain region 3. The distance between the source region 2 and the substrate well 7 is larger than the distance between the source region 2 and the drain region 3. The substrate well 7 thus corresponds to the substrate well 7 of the embodiment according to FIG. 1, but it is shallower in the embodiment according to FIG. 2, and its distance from the source region 2 may be smaller. The further substrate well 13 is deeper than the substrate well 7. The distance between the source region 2 and the further substrate well 13 is larger than the distance between the source region 2 and the substrate well 7. The doping concentration preferably decreases from the drain region 3 to the substrate well 7 and from the substrate well 7 to the further substrate well 13, so that the electrical conductivity is higher in the substrate well 7 than in the further substrate well 13.

If a body well 12 is provided, the further substrate well 13 is preferably deeper than the body well 12, so that the relatively steep pn-junction between the substrate well 7 or the further substrate well 13 and the body well 12 does not completely surround the substrate well 7 and the further substrate well 13, and a current flow between the further substrate well 13 and the deeper regions of the substrate 1 is facilitated. In this case the further substrate well 13 reaches down to a third maximal distance d3 from the surface 10 of the substrate 1, which is larger than the second maximal distance d2 from the surface 10 that is reached by the body well 12.

While the embodiment according to FIG. 1 may be preferred for holding voltages below typically 12 V, the further embodiment according to FIG. 2 is particularly advantageous for applications of the ESD protection semiconductor device in a high-voltage range of the holding voltage, typically at about 20 V, for example. Using the substrate well 7 and further substrate well 13, it is possible to keep the holding voltage between voltage values that differ by not more than 25%, for instance, or preferably by not more than 20% of a median value. Examples are maximal voltage ranges from 14 V to 18 V, from 17.5 V to 22.5 V, and from 21 V to 27 V (the differences amounting to 25% of 16 V, 20 V and 24 V, respectively), or from 18 V to 22 V, from 27 V to 33 V, and from 36 V to 44 V (the differences amounting to 20% of 20 V, 30 V and 40 V, respectively).

In preferred embodiments of the ESD protection semiconductor device, the range of the holding voltage may be kept narrower than 8 V, preferably narrower than 5 V, for various values of the trigger voltage. The further substrate well 13 may be provided according to the requirements of the desired maximal range of the holding voltage and the desired trigger voltage.

Figure 3:
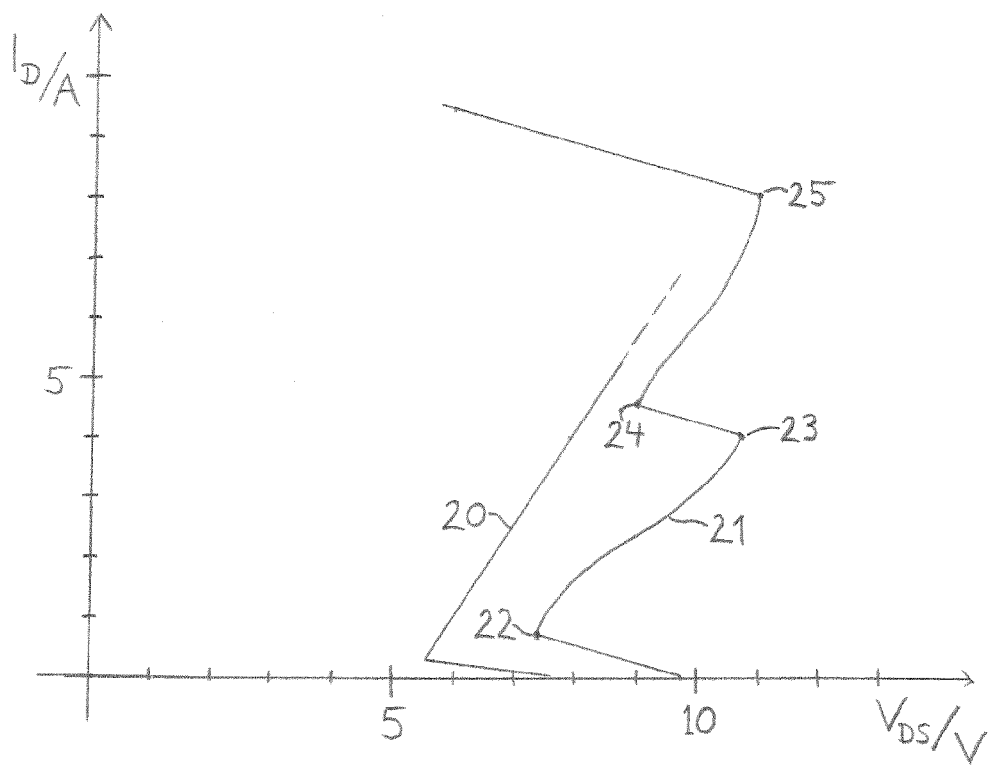
FIG. 3 shows a current/voltage diagram.

FIG. 3 is a diagram showing graphs of the drain current ID, measured in ampere, as a function of the drain-source voltage VDS, measured in volt. The left graph 20 represents a current-voltage function of a conventional device. The conventional ESD protection device is supposed to be triggered at about 7.5 V. When a snapback is triggered there is a momentary decrease of the drain-source voltage VDS to the value of a minimal holding voltage of about 5.5 V. Subsequently the drain current ID and the drain-source voltage VDS increase approximately linearly. The drain current ID may rise to a typical value of about 8 A at a drain-source voltage VDS of about 11 V.

In the diagram of FIG. 2 the right graph 21 represents a current-voltage function of an embodiment of the invention. The trigger voltage may be set according to the requirements of the intended application and may be typically about 9 V or 9.5 V, for example. The graph 21 shows a typical current-voltage function for a snapback triggered at about 9.5 V. When a snapback is triggered there is a momentary decrease of the drain-source voltage VDS to a minimal holding voltage of about 7 V to 7.5 V, corresponding to the indicated first point 22 on the graph 21. Then the drain current ID and the drain-source voltage VDS are simultaneously increasing. When the drain-source voltage VDS reaches a predefined limit, corresponding to the indicated second point 23 on the graph 21, a second snapback is triggered owing to the substrate well 7. The trigger voltage of the second snapback may be typically about 10.5 V, for example. With the triggering of the second snapback there is again a momentary decrease of the drain-source voltage VDS to a local minimum of about 9 V, corresponding to the indicated third point 24 on the graph 21. Then the drain current ID and the drain-source voltage VDS are once more increasing, and the fourth point 25 on the graph 21 is reached, where the drain current ID is typically about 8 A and the drain-source voltage VDS is typically about 11 V, for example. Then the drain-source voltage VDS decreases rapidly.

The second snapback prevents the drain-source voltage VDS from rising to values beyond a predefined upper limit, so that the holding voltage is kept within a narrow window between a minimal voltage value and an upper voltage limit. In the described example the range of the holding voltage is between about 7 V and about 11 V, the difference of 4 V being substantially less than the difference of more than 5.5 V in conventional devices.

The invention provides an ESD protection semiconductor device which allows to increase the trigger level and the holding voltage of the protecting transistor while maintaining high conduction levels at increased voltages. Advantages of the invention are a high trigger level, a high minimal holding voltage at low current, the increase of the holding voltage being limited by a second snapback switching a substrate well to the source region, a higher minimal holding voltage at the second snapback point, and a low level of the clamp voltage at very high currents. The ESD protection window can be kept in the range of conventional ESD protection devices.

This invention can particularly be realized using an NMOS device and an n-well as the substrate well 7, which is arranged at a distance from the gate to generate a second snapback after the transistor structure formed by the n-doped source region 2, the p-doped channel region 4 and the n-doped drain region 3 has been turned on. The trigger level of the first snapback scales with the channel length. The first trigger level may be sufficiently high to achieve a high overvoltage tolerance taking account of frequently occurring voltage spikes up to 8.5 V, and the holding voltage may be sufficiently high to prevent any damage while the circuit is in operation. The second snapback keeps the overall clamp voltage even at high ESD levels in a safe range to protect the active circuit blocks which are switched in parallel. The trigger level of the first snapback may thus be typically more than 2 V higher than in conventional devices, while drain currents of about 8 A go with a clamp voltage of about 11 V, which is comparable to standard ESD protection devices. The double snapback provides a higher resistance at low current levels during standard operation, thus higher ESD levels, as well as sufficiently high holding voltages in a triggered state together with sufficiently low clamp voltages in the range of high currents.

LIST OF REFERENCE NUMERALS 1 substrate
2 source region
3 drain region
4 channel region
5 body contact region
6 gate electrode
7 substrate well
8 interconnect
9 metal layer
10 surface
11 isolation region
12 body well
13 further substrate well
20 graph of an I/V function of a conventional device
21 graph of an I/V function of an inventive device
22 first point
23 second point
24 third point
25 fourth point
d1 first distance
d2 second distance
d3 third distance

The invention claimed is:

1. An ESD protection semiconductor device comprising:
a semiconductor substrate (1) with a surface (10);
a source region (2) and a drain region (3) of a first type of electrical conductivity arranged in the substrate (1) at or near the surface (10) at a distance from one another;
a channel region (4) of a second type of electrical conductivity, which is opposite to the first type of electrical conductivity, arranged between the source region (2) and the drain region (3);
a gate electrode (6) arranged above the channel region (4), characterized in that
a substrate well (7) of the first type of electrical conductivity is arranged in the substrate (1) at a distance from the source region (2),
the substrate well (7) is contiguous with the drain region (3), and
the distance between the source region (2) and the substrate well (7) is larger than the distance between the source region (2) and the drain region (3); and
a body well (12) of the second type of electrical conductivity,
the channel region (4) being located in the body well (12), and
the substrate well (7) reaching down to a maximal distance (d1) from the surface (10) of the substrate (1), said distance (d1) being larger than a maximal distance (d2) from the surface (10) reached by the body well (12).

2. An ESD protection semiconductor device comprising:
a semiconductor substrate (1) with a surface (10);
a source region (2) and a drain region (3) of a first type of electrical conductivity arranged in the substrate (1) at or near the surface (10) at a distance from one another;

a channel region (4) of a second type of electrical conductivity, which is opposite to the first type of electrical conductivity, arranged between the source region (2) and the drain region a gate electrode (6) arranged above the channel region (4), characterized in that a substrate well (7) of the first type of electrical conductivity is arranged in the substrate (1) at a distance from the source region (2), the substrate well (7) is contiguous with the drain region (3), and the distance between the source region (2) and the substrate well (7) is larger than the distance between the source region (2) and the drain region (3); and a further substrate well (13) of the first type of electrical conductivity arranged in the substrate (1) at a distance from the source region (2), the distance between the source region (2) and the further substrate well (13) being larger than the distance between the source region (2) and the substrate well (7), and the electrical conductivity of the further substrate well (13) being lower than the electrical conductivity of the substrate well (7).

3. The ESD protection semiconductor device of claim 1 or 2, wherein the substrate well (7) is arranged below an area of the substrate surface (10) that is encompassed by the drain region (3).

4. The ESD protection semiconductor device of claim 1 or 2, wherein the substrate well (7) has a lower doping concentration than the drain region (3).

5. The ESD protection semiconductor device of claim 2, further comprising:
    a body well (12) of the second type of electrical conductivity,
    the channel region (4) being located in the body well (12), and
    the further substrate well (13) reaching down to a maximal distance (d3) from the surface (10) of the substrate (1), said distance (d3) being larger than a maximal distance (d2) from the surface (10) reached by the body well (12).

6. The ESD protection semiconductor device of claim 1 or 2, wherein the distance between the source region (2) and the drain region (3) is adapted for a trigger voltage above 9 V and a holding voltage between 7 V and 11 V.

7. The ESD protection semiconductor device of claim 1 or 2, wherein the distance between the source region (2) and the drain region (3) is adapted for a trigger voltage above 9.5 V and a holding voltage between 7.5 V and 12 V.

8. The ESD protection semiconductor device of claim 1 or 2, wherein the distance between the source region (2) and the drain region (3) is adapted for a trigger voltage above 12 V and a holding voltage that is kept in a range between voltage values that differ by not more than 25% of a median value of the range.

9. The ESD protection semiconductor device of claim 1 or 2, wherein the distance between the source region (2) and the drain region (3) is adapted for a trigger voltage above 12 V and a holding voltage that is kept in a range between voltage values that differ by not more than 20% of a median value of the range.

10. The ESD protection semiconductor device of claim 1 or 2, wherein the range of the holding voltage is kept narrower than 8 V.

11. The ESD protection semiconductor device of claim 1 or 2, wherein the range of the holding voltage is kept narrower than 5 V.

12. The ESD protection semiconductor device of claim 1 or 2, further comprising:
    a further source region (2');
    a further channel region (4'); and
    a further gate electrode (6'),
    the source region (2) and the further source region (2') being arranged symmetrically to one another with respect to the drain region (3),
    the channel region (4) and the further channel region (4') being arranged symmetrically to one another with respect to the drain region (3),
    the gate electrode (6) and the further gate electrode (6') being arranged symmetrically to one another with respect to the drain region (3), and
    the distance between the further source region (2') and the substrate well (7) being larger than the distance between the further source region (2') and the drain region (3).

* * * * *